United States Patent

Blakeslee et al.

[15] 3,673,064

[45] June 27, 1972

[54] METHOD OF ELIMINATING COPPER CONTAMINATION

[72] Inventors: A. Eugene Blakeslee, Mount Kisco; Luther M. Foster, Chappaqua; Thomas S. Plaskett, Ossining, all of N.Y.

[73] Assignee: The United States of America as represented by the Secretary of the Army

[22] Filed: Oct. 29, 1970

[21] Appl. No.: 85,227

[52] U.S. Cl. ............................................... 204/147, 148/1.5

[51] Int. Cl. ........................................ C23f 13/00, H01l 7/00

[58] Field of Search ........................... 204/147, 196; 148/1.5

[56] References Cited

UNITED STATES PATENTS

| | | | |
|---|---|---|---|
| 3,347,768 | 10/1967 | Clark et al. | 204/196 |
| 3,424,660 | 1/1969 | Heinz-Gunter Klein et al. | 204/147 |

*Primary Examiner*—T. Tung
*Attorney*—Harry M. Saragovitz, Edward J. Kelly, Herbert Berl and Roy E. Gordon

[57] ABSTRACT

Copper contamination of gallium arsenide wafers is prevented when the wafers are rinsed with high-purity deionized water by applying a positive potential to the gallium arsenide wafer with respect to the rinse water.

1 Claim, No Drawings

METHOD OF ELIMINATING COPPER CONTAMINATION

BACKGROUND OF THE INVENTION

This invention relates in general to a method of preventing the contamination by noble metals of semiconductor materials, and in particular, to a method of preventing the contamination by copper of gallium arsenide when the gallium arsenide is rinsed with high-purity deionized water.

Noble metal contaminants, such as gold, silver, and copper are known to be detrimental to semiconductor materials such as silicon, germanium, gallium phosphide, and gallium arsenide. Particularly as concerns the contamination by copper of gallium arsenide, minute traces of copper are absorbed or plated on gallium arsenide wafers from high-purity deionized water during rinsing operations. On subsequent fabrication into devices, this copper is detrimental. For example, in Gunn effect devices, the copper causes a high-resistivity layer which is detrimental to oscillations.

SUMMARY OF THE INVENTION

The general object of this invention is to provide a method of preventing the contamination by noble metals of semiconductor materials. A particular object of this invention is to provide a method of preventing the contamination by copper of gallium arsenide when the gallium arsenide is rinsed with high-purity deionized water.

It has been found that the foregoing objects can be attained by applying a positive potential to the gallium arsenide wafer and a negative potential to the rinse water. This raises the potential of gallium arsenide with respect to the copper and prevents the plating of copper. The latter result is obtained because copper is lower in the electromotive series of materials than gallium arsenide and thus will normally plate out on copper in the absence of a change in the relative potentials of the two materials.

DETAILED DESCRIPTION OF THE PREFERRED EMBODIMENT

The method of this invention can be proved by the following experiment.

A dilute solution of acidified radioactive copper is placed in a platinum crucible. A gallium arsenide wafer is dipped in the solution and a 6-volt battery connected between the wafer and the crucible, the wafer being the anode. A duplicate run is made with no potential applied. The applied potential virtually eliminates the deposition of copper as demonstrated by a radioactivity of 400 counts per minute as contrasted with 31,000 counts per minute from the wafer treated in the usual way.

Thus, the invention makes possible a significant reduction in the amount of copper attracted to clean gallium arsenide surfaces during certain steps in surface preparation, particularly the final rinse in deionized water.

While there has been described what is at present considered to be the preferred embodiment of this invention, it will be obvious to those skilled in the art that various changes and modifications may be made therein without departing from the invention.

What is claimed is:

1. A method of preventing the contamination by copper of gallium arsenide during the rinsing of a gallium arsenide wafer with high-purity deionized water, said method comprising rinsing the gallium arsenide wafer while applying a positive potential to the gallium arsenide wafer with respect to the rinse water.

* * * * *